United States Patent
Kasumi et al.

(12)

(10) Patent No.: US 6,381,005 B1
(45) Date of Patent: *Apr. 30, 2002

(54) MASK HOLDING DEVICE, EXPOSURE APPARATUS AND DEVICE MANUFACTURING METHOD

(75) Inventors: Kazuyuki Kasumi; Takeshi Miyachi, both of Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 127 days.

(21) Appl. No.: 09/066,836

(22) Filed: Apr. 28, 1998

(30) Foreign Application Priority Data

May 9, 1997 (JP) ................................ 9-136078

(51) Int. Cl.[7] ............................ G03B 27/62; G21K 5/00
(52) U.S. Cl. .............................. 355/75; 378/34; 378/35
(58) Field of Search ........................... 355/75; 414/751; 378/34, 208; 250/548; 356/399, 400, 401

(56) References Cited

U.S. PATENT DOCUMENTS

| 3,569,718 | A | | 3/1971 | Borner ........................ 250/201 |
|---|---|---|---|---|
| 4,592,081 | A | | 5/1986 | Eaton et al. ................... 378/34 |
| 5,184,176 | A | | 2/1993 | Unno et al. ..................... 355/52 |
| 5,191,218 | A | | 3/1993 | Mori et al. ............. 250/453.11 |
| 5,225,686 | A | * | 7/1993 | Edo ............................. 250/548 |
| 5,356,686 | A | | 10/1994 | Fujioka et al. ................. 428/65 |
| 5,485,495 | A | | 1/1996 | Miyachi et al. ................ 378/34 |
| 5,504,793 | A | | 4/1996 | Chen ............................ 378/34 |
| 5,641,264 | A | * | 6/1997 | Kuno et al. .................. 414/751 |
| 5,854,819 | A | * | 12/1998 | Hara et al. ..................... 378/34 |

* cited by examiner

*Primary Examiner*—Russell Adams
*Assistant Examiner*—Peter B. Kim
(74) *Attorney, Agent, or Firm*—Fitzpatrick, Cella, Harper & Scinto

(57) ABSTRACT

An exposure device for transferring a pattern on a mask onto a wafer. The exposure device includes a frame for supporting the mask, a mask holding device including a correction mechanism for correcting the pattern on the mask by applying force to the mask frame, and a device for changing at least one of the attitude and position of the correction mechanism, in accordance with the attitude of the mask. The positional relationship between the correction mechanism and the mask does not vary even if the attitude of the mask is changed to adjust the exposure gap between the wafer and the mask. Accordingly, the amount of change in magnification to be corrected can be kept constant and precise magnification correction can be achieved.

11 Claims, 4 Drawing Sheets

FIG. IA
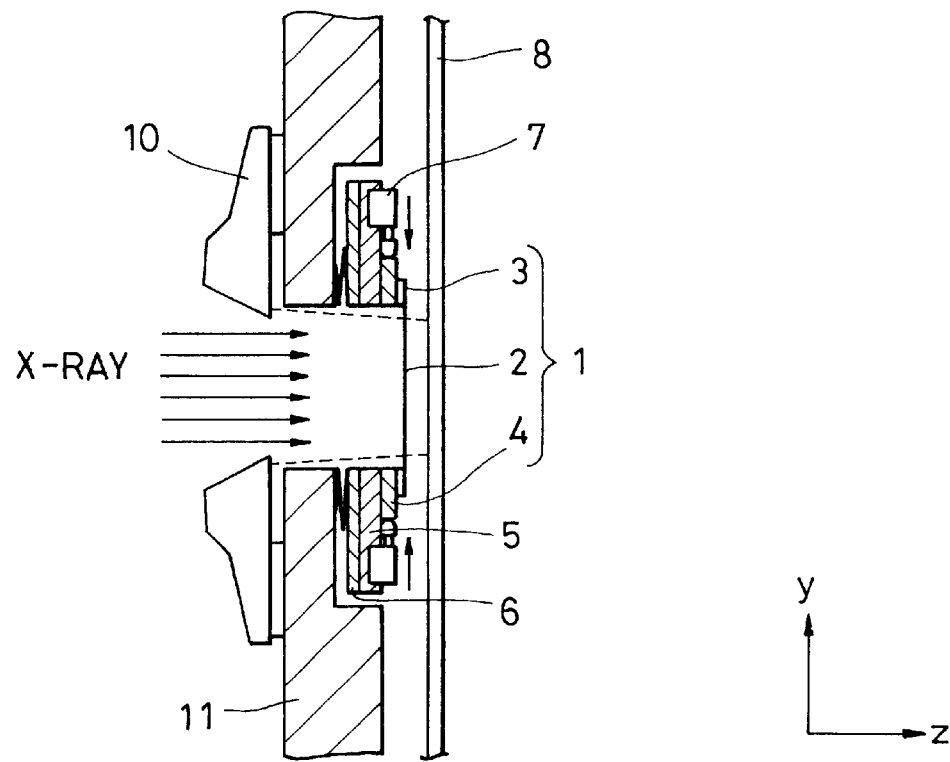
FIG. IB
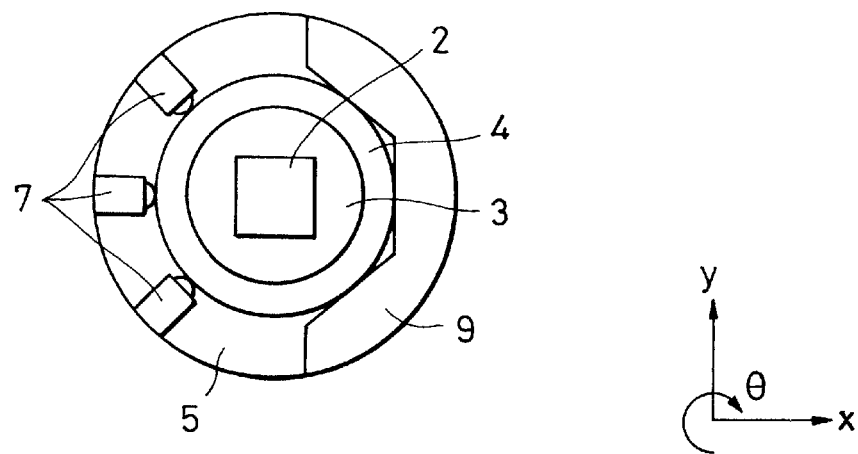

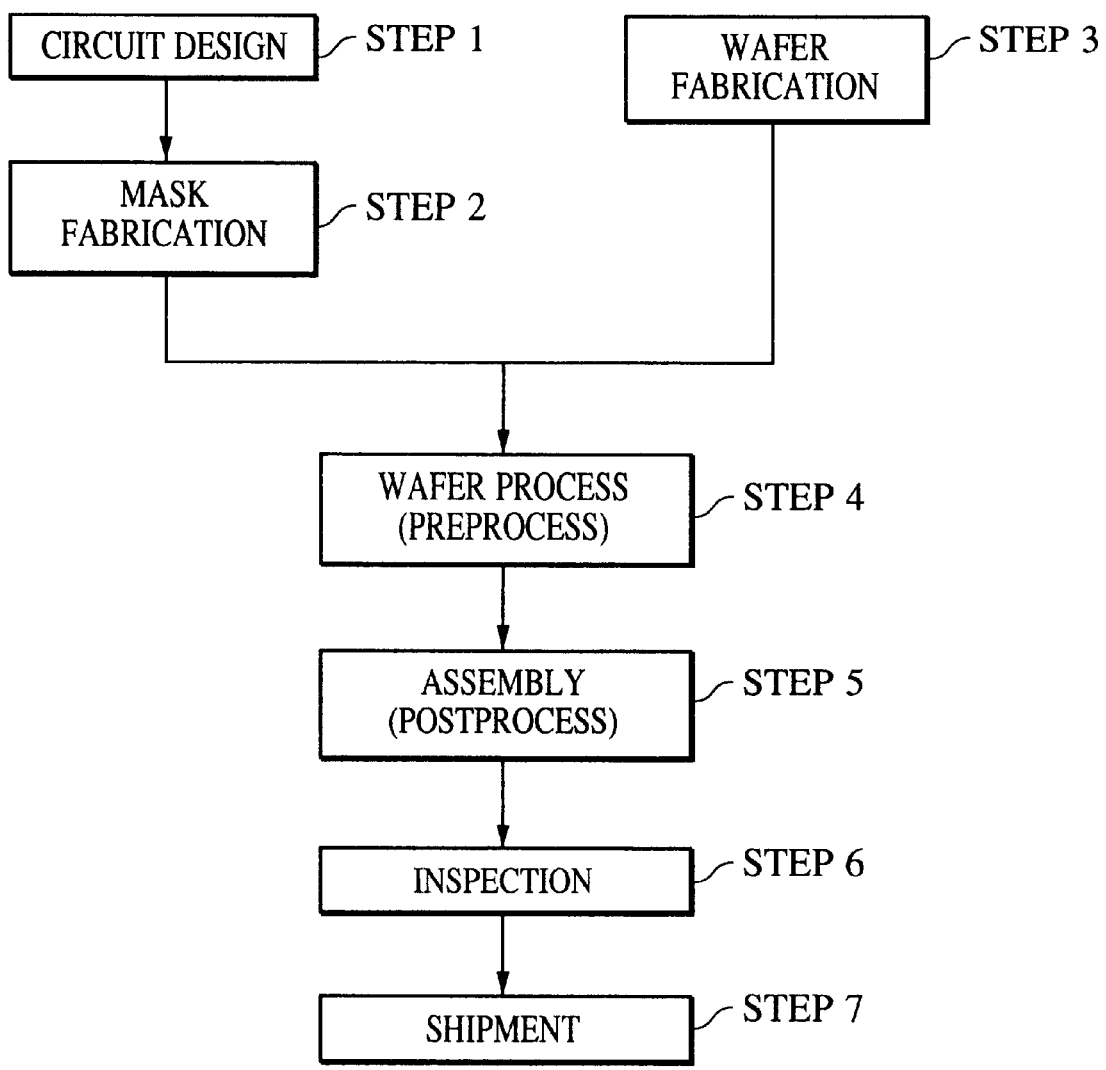

MASK HOLDING DEVICE, EXPOSURE APPARATUS AND DEVICE MANUFACTURING METHOD

BACKGROUND OF THE INVENTION

1. Field of the Invention

The present invention relates to a lithographic exposure technique for use in manufacturing semiconductor devices and the like, and more particularly, to a technique for correcting changes in the transfer magnification of a mask pattern.

2. Description of the Related Art

Recently, the fineness of circuit patterns has increased so that devices such as large-scale integrated circuits (LSIs) may have a higher level of integration and a higher operating speed. As an exposure technique expected to be employed in the future in manufacturing these LSIs, much attention is currently being focused on an X-ray exposure method that forms fine circuit patterns by using high-intensity X-rays from an SR (synchrotron radiation) source or the like. An X-ray proximity exposure method is also proposed. This method uses soft X-rays having wavelengths ranging from 0.5 nm to 2 nm. In an optical system utilized in this X-ray proximity exposure method, for example, X-rays emitted from a source are enlarged to a predetermined field size by an X-ray mirror and are radiated through an X-ray mask onto a wafer substrate that opposes the X-ray mask, thereby transferring a pattern onto the wafer substrate.

An apparatus that uses the X-ray proximity exposure method described above is different in structure from a conventional optical exposure apparatus that uses ultraviolet rays and the like, and, it is difficult to adjust the magnification for exposure transfer onto the wafer substrate through the use of the X-ray optical system. This is an inherent problem of the X-ray optical system that arises because a magnification correction made by an optical system composed of lenses is difficult to apply to the X-ray optical system.

Accordingly, there is a proposal of using a magnification correction method for the X-ray exposure apparatus that positively deforms a mask substrate by applying an in-plane stress or an out-of-plane stress thereto in order to thereby control the magnification of a pattern on a mask membrane of the mask substrate. U.S. Pat. No. 4,592,081 discloses a method that applies an in-plane stress to the mask substrate. In this method, a clamp mechanism of a mask chuck is provided with a mechanical means using an electrostrictive device, and a mask support frame is deformed by the mechanical means, whereby a mask substrate mounted on the mask support frame is expanded and contracted.

Since the pattern on the mask membrane is expanded and contracted by externally applying the force to the mask in the above-mentioned conventional magnification correction method, for there to be magnification correction with high reproducibility, it is important that the point of action of the external force applied to the mask always be fixed.

Strictly speaking, the surface of the mask membrane and the surface on which a mask is supported (i.e., the mask chucking surface) are, however, typically not parallel due to manufacturing tolerances. Therefore, an adjustment of the attitude of the mask is required in order to maintain a uniform exposure gap between the mask membrane and the wafer substrate. Furthermore, the surface of the wafer substrate and the surface of the mask membrane must be maintained parallel to each other during exposure. Since, however, the surface of the wafer substrate generally has a shape in the form of wedges or undulations, that is, it is not uniform in thickness, it is necessary to set the exposure gap shot-by-shot in step-and-repeat exposure. The exposure gap is corrected by changing the attitude of the mask.

At this time, if the attitude of the mask varies independently of the magnification correction mechanism, the point of action of the external force to be applied by the magnification correction mechanism is displaced. This creates a concern that the amount of change in the magnification will vary even when the force that is applied before the attitude adjustment is the same as that applied after the attitude adjustment.

SUMMARY OF THE INVENTION

The present invention has been made in view of the aforesaid unsolved problem of the prior art, and has as an object the provision of a mask holding device capable of precisely correcting the magnification without varying the amount of change in magnification even when the attitude of a mask varies, an exposure apparatus equipped with the mask holding device, and a device manufacturing method capable of efficiently manufacturing a semiconductor device.

In order to achieve the above object, according to one aspect, the present invention provides a mask holding device including a frame for supporting a mask, a correction mechanism for correcting a pattern on a mask membrane of the mask by applying force to the mask frame, and means for changing at least one of the attitude and position of the correction mechanism, in accordance with the attitude of the mask.

According to another aspect, the present invention provides an exposure apparatus for exposing a mask having a pattern on a mask membrane, and a substrate, placed a small distance apart, the exposure apparatus including a frame for supporting the mask, a mask holding device having a correction mechanism for correcting the pattern by applying force to the mask frame, and means for changing at least one of the attitude and position of the correction mechanism, in accordance with the attitude of the mask.

According to a further aspect, the present invention provides a device manufacturing method including placing a mask having a pattern on a mask membrane, and a substrate, a small distance apart, supporting the mask on a frame, providing an exposure apparatus that includes a mask holding device having a correction mechanism for correcting the pattern by applying force to the mask frame, changing at least one of the attitude and position of the correction mechanism, in accordance with the attitude of the mask, and performing exposure by exposing the substrate to the pattern on the mask, to manufacture a device.

According to the present invention, the point of action and direction of the load to be imposed on the mask always can be constant regardless of the attitude of the mask. As a result, the amount of change in magnification to be corrected does not vary even when the attitude of the mask varies, which achieves magnification correction with an increased precision.

BRIEF DESCRIPTION OF THE DRAWINGS

FIG. 1A is a partial sectional view schematically showing the structure of an exposure apparatus according to a first embodiment of the present invention.

FIG. 1B is a front view of a mask stage in the exposure apparatus shown in FIG. 1A, viewed from the wafer side.

FIG. 3 is a flowchart showing semiconductor device manufacturing processes.

DESCRIPTION OF THE PREFERRED EMBODIMENTS

Figure 2A:
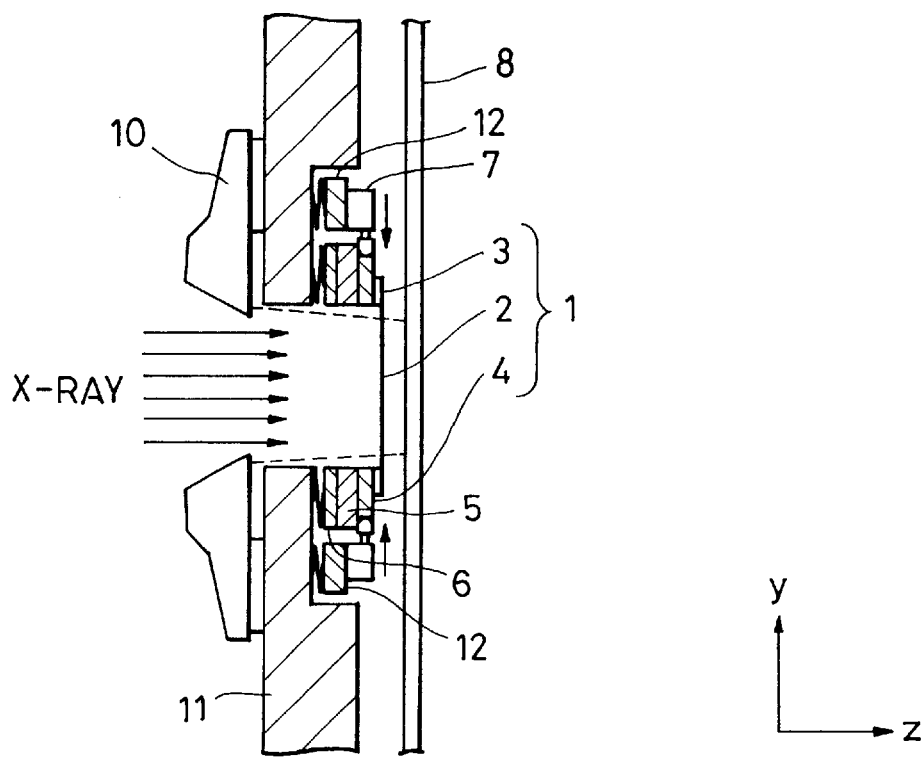
FIG. 2A is a partial sectional view schematically showing the structure of an exposure apparatus according to a second embodiment of the present invention

The preferred embodiments of the present invention will now be described with reference to the attached drawings.

FIG. 1A is a partial sectional view schematically showing the structure of an exposure apparatus according to a first embodiment of the present invention, and FIG. 1B is a front view of a mask stage in the exposure apparatus shown in FIG. 1A, viewed from the wafer side.

The exposure apparatus of the present invention is an X-ray proximity exposure apparatus for transferring a circuit pattern, which is drawn on a mask membrane 2 having a high transmittance for X-rays, onto a wafer 8 placed at a small distance of about 10 $\mu$m to 30 $\mu$m from the mask membrane 2, by exposure to X-rays. FIGS. 1A and 1B show only the configuration adjacent to a mask stage in the X-ray exposure apparatus.

Referring to FIGS. 1A and 1B, a mask 1 is formed by bonding a mask substrate 3, having the mask membrane 2 with a circuit pattern drawn thereon, to a mask frame 4, and is chucked by a mask θ-stage 5. It is preferable that the mask chucking surface be supported at three points in order to reduce the influence of friction thereon because the magnification is to be corrected by imposing a load on the mask frame 4. Moreover, reproducibility in the magnification correction (i.e., the ratio of correction to load) is maintained by always supporting the mask chucking surface at the same points. A V-block 9 is utilized to position the mask 1, and three magnification correction mechanisms 7 are mounted on the mask θ-stage 5 opposed to the V-block 9. The magnification correction mechanisms 7 each has a protrusion or point of contact for imposing a load on the mask frame 4, an electrostrictive device for generating the load, and a load cell for measuring the load, and are structured so that they press the mask frame 4 while controlling the load. In this way, the magnification correction mechanisms 7 distort the mask frame 4 chucked by the mask θ-stage 5 by imposing the load thereon from the periphery, and reduce the circuit pattern drawn on the mask membrane 2, thereby correcting the magnification. The magnification correction is made only in a direction that will contract the pattern. The drawn pattern is enlarged by about 10 ppm in a state in which no load is imposed on the mask 1. It is required that the relationship between the amount of magnification to be corrected and the load be determined in advance from collected data and that this information be stored as a parameter in the exposure apparatus. This method makes it possible to omit a system for measuring the amount of magnification correction and to thereby simplify the apparatus, compared with a method of directly measuring the amount of magnification correction by a certain type of measuring system and feeding the measured amount back to the load. In addition, since there is no need to measure the amount of magnification correction directly, the throughput can be improved.

The mask θ-stage 5 with the magnification correction mechanisms 7 thereon is mounted on a mask tilting stage 6 that is movable in the Z-tilting direction relative to an exposure apparatus frame 11. Therefore, even when the attitude of the mask 1 is changed by the mask tilting stage 6, the relative positional relationship between the magnification correction mechanisms 7 and the mask 1 does not vary, and the magnification correction mechanisms 7 can always impose a load at the same positions on the mask 1. Since the magnification correction mechanisms 7 are thus mounted on the mask tilting stage 6 through the mask θ-stage 5 and united to the mask tilting stage 6, even when the attitude of the mask 1 is adjusted by driving the mask tilting stage 6 in setting the exposure gap between the wafer 8, serving as a substrate, and the mask 1, the positions on the mask 1 to be pressed do not vary, that is, the magnification correction is not dependent on the attitude of the mask 1.

An alignment detection system 10 detects alignment marks (not shown) on the mask membrane 2 and the wafer 8, and controls the positional relationship between the mask membrane 2 and the wafer 8.

Next, the procedure for transferring the mask pattern onto the wafer 8 will be described.

The mask 1, which is formed by bonding the mask substrate 3 having the mask membrane 2 to the mask frame 4, is set against the V-block 9, and then, is chucked by the mask θ-stage 5. The magnification correction mechanisms 7 impose the load on the mask frame 4, thereby correcting the magnification of the mask pattern to a predetermined design value. The mask tilting stage 6 is driven so that the plane of the mask membrane 2 is parallel to a wafer stage (not shown). Next, the wafer 8 is conveyed, alignment marks (not shown) in several shots on the wafer 8 are measured by the alignment detection system 10, and the shot layout and the magnification are calculated from the measurement result. The mask θ-stage 5 is driven based on the calculation result to turn the mask 1 so that the mask 1 aligns with the wafer pattern. Furthermore, the load to be imposed by the magnification correction mechanisms 7 is adjusted so that the transfer magnification of the mask 1 is adjusted to the pattern size on the wafer. After that, the wafer 8 is moved to each shot position, and exposure is sequentially performed. At each shot position, the mask tilting stage 6 is driven so that the wafer surface in the exposed area is parallel to the mask membrane 2.

As mentioned above, it is required that the attitude of the mask be changed in the θ and tilting directions during exposure so that the wafer and the mask membrane are aligned with each other. The attitudes of the magnification correction mechanisms 7 are also changed with the change of the attitude of the mask, and the direction and point of action of the load to be imposed on the mask frame are thereby kept constant. Accordingly, even when the attitude of the mask varies, the magnification can be kept constant, which achieves magnification correction with high reproducibility with respect to the load.

While the magnification correction mechanisms in this embodiment adjust the load to a preset target value, they are applicable to a method of controlling the load based on the amount of change in magnification of the mask detected by a detection system, or a method of controlling the amount of displacement of the mask, which enhances the precision and throughput. The magnification correction mechanisms are also applicable to an EB (Electron-Beam) writing apparatus.

Figure 2B:
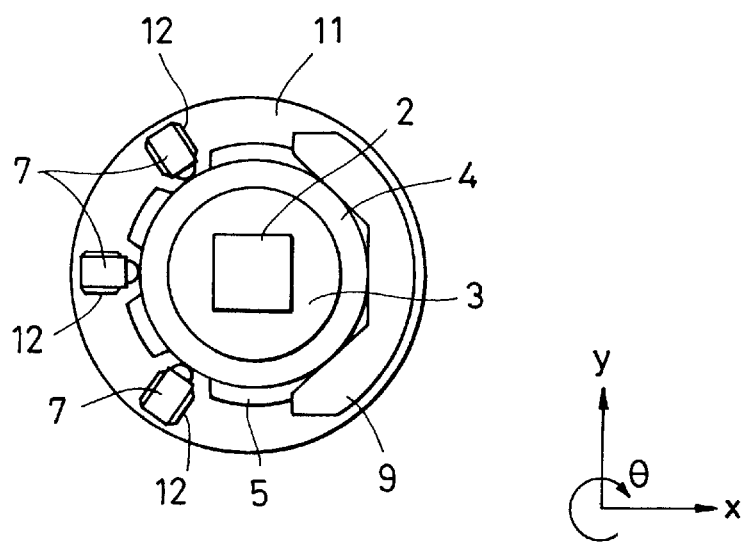
FIG. 2B is a front view of a mask stage in the exposure apparatus shown in FIG. 2A, viewed from the wafer side.

Next, a second embodiment of the present invention will be described. FIGS. 2A and 2B correspond to FIGS. 1A and 1B of the first embodiment, respectively. This embodiment is different from the first embodiment in that the magnification correction mechanisms 7 are mounted on independent stages that are separate from the mask stage.

Referring to FIGS. 2A and 2B, a mask 1, which is formed by bonding a mask substrate 3 with a mask membrane 2 to a mask frame 4, is supported on a mask θ-stage 5, and the mask θ-stage 5 is mounted on a mask tilting stage 6 that is movable in the Z tilting direction relative to an exposure apparatus frame 11. The magnification correction mechanisms 7 are mounted on respective magnification correction stages 12 that are movable in the tilting and θ directions on the exposure apparatus frame 11, and are able to separately change the points of action and directions of the load to be imposed on the mask 1. The structure of the magnification correction mechanisms 7 is the same as that of the aforesaid first embodiment. Therefore, a description thereof is omitted.

The function of the magnification correction stages 12 will now be described. Each of the magnification correction stages 12 drives a corresponding magnification correction mechanism 7 in response to a change of attitude of the mask 1 during adjustment so that the point of action and direction of the load to be imposed on the mask 1 are kept constant. That is, each magnification correction stage 12 moves a corresponding magnification correction mechanism 7 in the circumferential direction when the mask 1 is moved in the θ direction, and changes the height and attitude of the corresponding magnification correction mechanism 7 when the mask 1 is moved in the tilting direction.

Such a drive of the magnification correction stage 12 in accordance with the attitude of the mask makes it possible to always impose the load for magnification correction onto the same portion of the mask in the same direction.

As mentioned above, it is required that the attitude of the mask be changed in the θ and tilting directions during exposure for alignment of the mask membrane with the wafer. At this time, the attitudes of the magnification correction mechanisms are also changed, so that the point of action and direction of the load to be imposed on the mask frame can be kept constant, and the magnification can also be kept constant even when the attitude of the mask varies. As a result, it is possible to achieve magnification correction with high reproducibility with respect to the load.

While the magnification correction mechanisms in this embodiment adjust the load to a preset target value, they are also applicable to a method of controlling the load based on the amount of change in magnification of the mask detected by a detection system, or a method of controlling the amount of displacement of the mask, which enhances the precision and throughput. The magnification correction mechanisms are also applicable to the EB writing apparatus.

An example of a device manufacturing method using the above-mentioned exposure apparatus will next be described.

FIG. 3 is a flowchart showing processes of manufacturing a microelectronic device (e.g., a semiconductor chip such as an IC or an LSI, a liquid crystal panel, a CCD, a thin-film magnetic head, a micromachine, and the like). In Step 1 (circuit design), a circuit pattern of the device is designed. In Step 2 (mask fabrication), a mask on which the designed pattern is formed is fabricated. On the other hand, in Step 3 (wafer fabrication), a wafer is fabricated by using a material such as silicon or glass. In Step 4 (wafer forming process), called a preprocess, an actual circuit is formed on the wafer by lithography using the above prepared mask and wafer. In the next step, Step 5 (assembly), called a postprocess, a semiconductor chip is manufactured by using the wafer fabricated in Step 4, and an assembly process (e.g., dicing, bonding), a packaging process (chip sealing) and the like are included in this step. In step 6 (inspection), the semiconductor device manufactured in Step 5 is subjected to a performance test, an endurance test, and the like. The semiconductor device is completed through these steps, and then shipped (Step 7).

Figure 4:
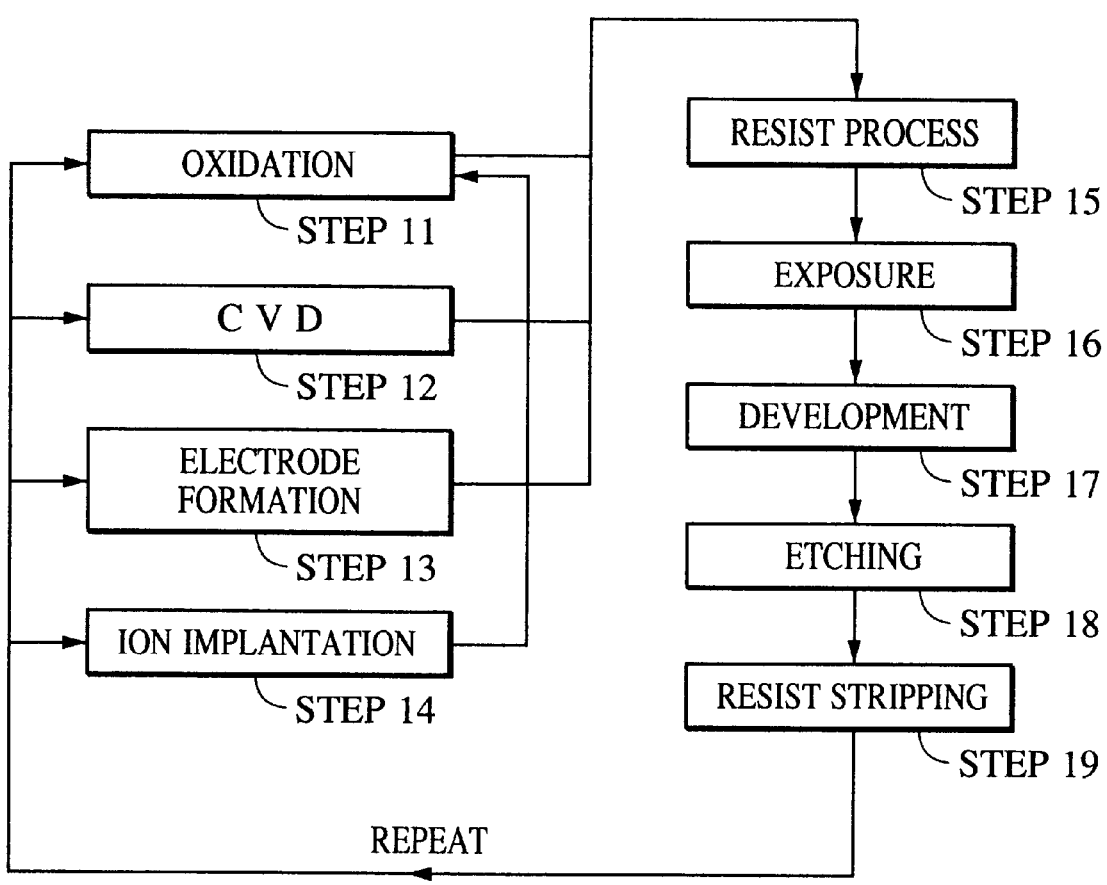
FIG. 4 is a detailed flowchart showing a wafer forming process.

FIG. 4 is a detailed flowchart of the above wafer forming process. In Step 11 (oxidation, the surface of the wafer is oxidized. In Step 12 (CVD), an insulating film is formed on the surface of the wafer. In Step 13 (electrode formation), electrodes are formed on the wafer by evaporation. In Step 14 (ion implantation), ions are implanted into the wafer. In Step 15 (resist process), a photosensitive material is applied on the wafer. In Step 16 (exposure), the circuit pattern of the mask is printed on the wafer though exposure by an exposure apparatus equipped with an aligner. In Step 17 (development), the exposed wafer is developed. In Step 18 (etching), parts other than the developed resist image are cut away. In Step 19 (resist stripping), the resist that is unnecessary after etching is removed. By repeating these steps, multiple circuit patterns are formed on the wafer.

According to the above-mentioned manufacturing method, it is possible to manufacture highly integrated devices, which were difficult to manufacture before, at low cost.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A mask holding device comprising:
    a mask stage having a mask chuck for chucking a mask, said mask stage changing an attitude of the mask; and
    a correction mechanism for correcting a pattern on a mask membrane of the mask by applying force to a frame which supports the mask after the mask is chucked by the mask chuck on said mask stage, wherein said correction mechanism is mounted on said mask stage.

2. An exposure apparatus for exposing a mask, having a pattern on a mask membrane, onto a substrate, placed a small distance apart, said exposure apparatus comprising:
    a mask stage having a mask chuck for chucking the mask, said mask stage changing an attitude of the mask; and
    a mask holding device including a correction mechanism for correcting the pattern by applying force to a frame which supports the mask after the mask is chucked by the mask chuck on said mask stage, wherein said correction mechanism is mounted on said mask stage.

3. An exposure apparatus according to claim 2, wherein the exposure is performed by using X-rays.

4. A device manufacturing method comprising the steps of:
    placing a mask, having a pattern on a mask membrane, and a substrate a small distance apart;

chucking the mask using a mask stage having a mask chuck:

changing an attitude of the mask using the mask stage;

providing an exposure apparatus that includes a mask holding device having a correction mechanism, the correction mechanism being mounted on the mask stage;

correcting the pattern, using the correction mechanism, by applying force to a frame which supports the mask after the mask is chucked by the mask chuck on the mask stage; and performing exposure using the exposure apparatus by exposing the substrate to the pattern on the mask, to manufacture a device.

5. A method according to claim 4, wherein the exposure is performed by using X-rays.

6. A mask holding device comprising:

a mask stage having a mask chuck for chucking a mask, said mask stage changing an attitude of the mask in a tilt direction; and a correction mechanism, mounted on said mask stage, for correcting a pattern on a mask membrane of the mask by applying force to a frame which supports the mask after the mask is chucked by the mask chuck on said mask stage.

7. A mask holding device according to claim 6, wherein said correction mechanism applies the force continually during an exposure operation.

8. An exposure apparatus for exposing a mask, having a pattern on a mask membrane, onto a substrate, placed a small distance apart, said exposure apparatus comprising:

a mask stage having a mask chuck for chucking the mask, said mask stage changing an attitude of the mask in a tilt direction; and a mask holding device including a correction mechanism, mounted on said mask stage, for correcting the pattern by applying force to a frame which supports the mask after the mask is chucked by the mask chuck on said mask stage.

9. An exposure apparatus according to claim 8, wherein said correction mechanism applies the force continually during an exposure operation.

10. A device manufacturing method comprising the steps of:

placing a mask, having a pattern on a mask membrane, and a substrate a small distance apart;

chucking the mask using a mask stage having a mask chuck;

changing an attitude of the mask in a tilt direction using the mask stage;

providing an exposure apparatus that includes a mask holding device having a correction mechanism, the correction mechanism being mounted on the mask stage;

correcting the pattern, using the correction mechanism, by applying force to a frame which supports the mask after the mask is chucked by the mask chuck on the mask stage; and performing exposure using the exposure apparatus by exposing the substrate to the pattern on the mask, to manufacture a device.

11. A device manufacturing method according to claim 10, further comprising applying the force by the correction mechanism in said correcting step continually during exposure.

* * * * *

UNITED STATES PATENT AND TRADEMARK OFFICE
CERTIFICATE OF CORRECTION

PATENT NO. : 6,381,005 B1
DATED : April 30, 2002
INVENTOR(S) : Kazuyuki Kasumi et al.

It is certified that error appears in the above-identified patent and that said Letters Patent is hereby corrected as shown below:

<u>Column 3,</u>
Line 3, "invention" should read -- invention, and --.

Signed and Sealed this

Eighteenth Day of June, 2002

Attest:

Attesting Officer

JAMES E. ROGAN
Director of the United States Patent and Trademark Office